United States Patent
He et al.

(10) Patent No.: US 10,109,236 B2
(45) Date of Patent: Oct. 23, 2018

(54) COMPENSATION CIRCUIT AND ORGANIC LIGHT EMITTING DIODE DISPLAY DEVICE

(71) Applicant: Shenzhen China Star Optoelectronics Technology Co., Ltd., Shenzhen, Guangdong (CN)

(72) Inventors: Jian He, Guangdong (CN); Shen-sian Syu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 116 days.

(21) Appl. No.: 15/327,619

(22) PCT Filed: Dec. 23, 2016

(86) PCT No.: PCT/CN2016/111698
§ 371 (c)(1),
(2) Date: Jan. 19, 2017

(87) PCT Pub. No.: WO2018/072312
PCT Pub. Date: Apr. 26, 2018

(65) Prior Publication Data
US 2018/0218679 A1    Aug. 2, 2018

(30) Foreign Application Priority Data
Oct. 19, 2016  (CN) .......................... 2016 1 0912023

(51) Int. Cl.
*G09G 3/3258*    (2016.01)
*H01L 27/32*    (2006.01)

(52) U.S. Cl.
CPC ....... *G09G 3/3258* (2013.01); *H01L 27/3244* (2013.01); *G09G 2300/0814* (2013.01);
(Continued)

(58) Field of Classification Search
CPC ...... G09G 3/3258; G09G 3/32; G09G 3/3208; G09G 3/3255; G09G 2310/0251;
(Continued)

(56) References Cited

U.S. PATENT DOCUMENTS 8,982,017 B2 * 3/2015 Lee ...................... G09G 3/3225
345/76
2005/0093788 A1    5/2005 Shin
(Continued)

FOREIGN PATENT DOCUMENTS

CN    103596344 A    2/2014
KR    1020080025591 A    3/2008

*Primary Examiner* — Darlene M Ritchie
(74) *Attorney, Agent, or Firm* — Andrew C. Cheng

(57) ABSTRACT

A compensation circuit and an Organic Light Emitting Diode (OLED) device are disclosed. The compensation circuit includes a driver switch for driving a load, a reset energy storage element coupled to a to-be-reset terminal of the driver switch; and a reset charging circuit coupled to the reset energy storage element. During when the driver switch is reset, the reset charging circuit sequentially outputs a fast charging signal and a reset initialization signal to the reset energy storage element; the fast charging signal is for fast charging the reset energy storage element. The reset initialization signal is for adjusting the voltage output from the reset energy storage element to the driver switch's to-be-reset terminal to a preset voltage. Through the above design, the reset energy storage element may be fast charged with reduced charging time during the Reset stage, enhancing the Reset efficiency.

6 Claims, 2 Drawing Sheets

(52) U.S. Cl.
CPC ............... *G09G 2310/0251* (2013.01); *G09G 2310/0297* (2013.01); *G09G 2310/061* (2013.01); *G09G 2320/045* (2013.01)

(58) Field of Classification Search
CPC ..... G09G 2310/061; G09G 2310/0297; G09G 2300/0814; G09G 2320/045; H01L 27/3244
See application file for complete search history.

(56) References Cited

U.S. PATENT DOCUMENTS

| | | | |
|---|---|---|---|
| 2006/0208979 A1* | 9/2006 | Fish | G09G 3/3233 345/81 |
| 2009/0309863 A1 | 12/2009 | Seto | |
| 2011/0285691 A1* | 11/2011 | Takasugi | G09G 3/3233 345/212 |
| 2013/0050292 A1* | 2/2013 | Mizukoshi | G09G 3/3291 345/690 |
| 2013/0106823 A1* | 5/2013 | Kishi | G09G 3/3258 345/211 |
| 2014/0168180 A1* | 6/2014 | Kim | H05B 33/0896 345/205 |
| 2014/0340432 A1* | 11/2014 | Chaji | G09G 3/3233 345/690 |
| 2015/0379934 A1 | 12/2015 | Xiaoling | |
| 2016/0217735 A1* | 7/2016 | Park | G09G 3/3233 |

\* cited by examiner

COMPENSATION CIRCUIT AND ORGANIC LIGHT EMITTING DIODE DISPLAY DEVICE

BACKGROUND OF THE INVENTION

1. Field of the Invention

The present disclosure generally relates to display techniques, and particularly relates to a compensation circuit and an organic light emitting diode display device.

2. The Related Arts

Active Matrix Organic Light Emitting Diode (AMOLED) is a new display and lighting technique that controls currents flowing through the LEDs by Thin Film Transistor (TFT) drivers. The TFTs' threshold voltages may shift due to factors such as light illumination, stress, the voltage between source and drain, etc., causing the threshold voltages to shift, affecting the currents flowing through the LEDs, and leading to un-uniform display.

Existing solutions try to resolve the shift of the driver TFTs' threshold voltages by compensation. A Reset stage of the compensation process resets the gate and source voltages of the driver TFTs by charging a capacitor through a reset initialization signal Vini so that driver TFTs' gate and source voltages are reset to Vini. In reality, however, there is only limited time for the Reset stage. In the meantime, the driver TFTs' cut off condition VGL−Vini<Vth has to be satisfied, where Vth is the threshold voltage of the driver TFTs. As such, the reset initialization signal Vini cannot be too low. This leads to that the capacitor is not fully charged during the Reset stage, and the gate and source voltages of the driver TFTs do not reach the preset level Vini. The compensation effect is therefore compromised. An improved design capable of reducing capacitor charging time and enhancing Reset efficiency is desired.

SUMMARY OF THE INVENTION

The present disclosure provides a compensation circuit and an Organic Light Emitting Diode (OLED) device where the reset energy storage element may be fast charged with reduced charging time during the Reset stage and the Reset efficiency is enhanced.

A technical solution taught by the present disclosure is a compensation circuit including a driver switch for driving a load, a reset energy storage element coupled to a to-be-reset terminal of the driver switch, a reset charging circuit coupled to the reset energy storage element. During when the driver switch is reset, the reset charging circuit sequentially outputs a fast charging signal and a reset initialization signal to the reset energy storage element, the fast charging signal is for fast charging the reset energy storage element, and the reset initialization signal is for adjusting the voltage output from the reset energy storage element to the driver switch's to-be-reset terminal to a preset voltage.

The reset charging circuit includes a multiplexer having a first reset signal input terminal, a second reset signal input terminal, a reset output terminal, and a reset control terminal. The first reset signal input terminal receives the fast charging signal, the second reset signal input terminal receives the reset initialization signal, and the reset control terminal receives a selection signal, and the selection signal sequentially selects the fast charging signal and the reset initialization signal to output from the reset output terminal.

The compensation circuit further includes a reset switch electrically connected between the reset output terminal and the reset energy storage element, a control terminal of the reset switch receives a first pulse signal, the first pulse signal is synchronous with the selection signal and has a larger pulse width than that of the selection signal.

The compensation circuit further includes a first switch and a second switch. The first switch has an input terminal receiving a reference signal, and an output terminal electrically connected to the reset energy storage element and the driver switch's to-be-reset terminal. The second switch has an input terminal electrically connected to the output terminal of the first switch, and an output terminal electrically connected between the reset switch and the reset control terminal of the multiplexer. A control terminal of the second switch receives a first pulse signal, and a control terminal of the first switch receives a second pulse signal, which lags behind the first pulse signal.

The reset energy storage element includes an energy storage capacitor whose two ends are electrically connected to the driver switch's gate and source, respectively, and the source of the driver switch is coupled to the reset charging circuit.

The fast charging signal has a lower level than that of the reset initialization signal.

Another technical solution taught by the present disclosure is an Organic Light Emitting Diode (OLED) device, including a compensation circuit and an OLED. The compensation circuit includes a driver switch for driving the OLED, a reset energy storage element coupled to a to-be-reset terminal of the driver switch, and a reset charging circuit coupled to the reset energy storage element. During when the driver switch is reset, the reset charging circuit sequentially outputs a fast charging signal and a reset initialization signal to the reset energy storage element, the fast charging signal is for fast charging the reset energy storage element, and the reset initialization signal is for adjusting the voltage output from the reset energy storage element to the driver switch's to-be-reset terminal to a preset voltage.

The reset charging circuit includes a multiplexer having a first reset signal input terminal, a second reset signal input terminal, a reset output terminal, and a reset control terminal. The first reset signal input terminal receives the fast charging signal, the second reset signal input terminal receives the reset initialization signal, and the reset control terminal receives a selection signal, and the selection signal sequentially selects the fast charging signal and the reset initialization signal to output from the reset output terminal.

The compensation circuit further includes a reset switch electrically connected between the reset output terminal and the reset energy storage element. A control terminal of the reset switch receives a first pulse signal which is synchronous with the selection signal and has a larger pulse width than that of the selection signal.

The compensation circuit further includes a first switch and a second switch. The first switch has an input terminal receiving a reference signal, and an output terminal electrically connected to the reset energy storage element and the driver switch's to-be-reset terminal. The second switch has an input terminal receiving the first pulse signal, and an output terminal electrically connected between the reset switch and the reset control terminal of the multiplexer. A control terminal of the second switch receives the first pulse signal, and a control terminal of the first switch receives a second pulse signal, which lags behind the first pulse signal.

Compared to prior art, the compensation circuit employs a multiplexer to select a fast charging signal to fast charge a reset energy storage element during a Reset stage to reset a driver switch's threshold voltage. The compensation circuit reduces the charging time of the reset energy storage element during the Rest stage and enhances Reset efficiency.

BRIEF DESCRIPTION OF THE DRAWINGS

To make the technical solution of the embodiments according to the present disclosure, a brief description of the drawings that are necessary for the illustration of the embodiments will be given as follows. Apparently, the drawings described below show only example embodiments of the present disclosure and for those having ordinary skills in the art, other drawings may be easily obtained from these drawings without paying any creative effort. In the drawings.

DETAILED DESCRIPTION OF THE PREFERRED EMBODIMENTS

In the following, the present disclosure is explained in details through embodiments and accompanying drawings. It should be understood that not all possible embodiments are disclosed. Other embodiments derived from the following embodiments by a reasonably skilled person in the art without significant inventive effort should be considered to be within the scope of the present disclosure.

Figure 1:
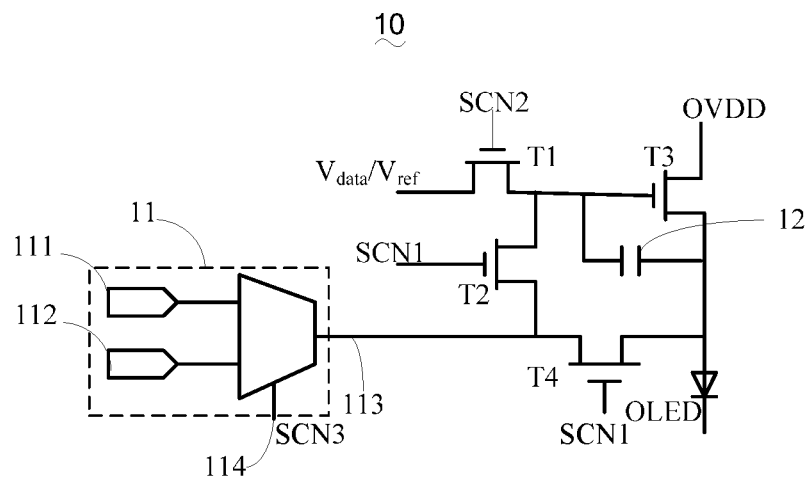
FIG. 1 is a circuit schematic diagram showing a compensation circuit according to an embodiment of the present disclosure.

FIG. 1 is a circuit schematic diagram showing a compensation circuit according to an embodiment of the present disclosure. As illustrated, the compensation circuit 10 includes a driver switch T3, a reset energy storage element 12, and a reset charging circuit 11.

The driver switch T3 is for driving a load, whose source is electrically connected to the anode of an Organic Light Emitting Diode (OLED) and whose drain is electrically connected a positive power voltage OVDD.

The reset energy storage element 12 includes an energy storage capacitor whose two ends are electrically connected to the driver switch T3's gate and source, respectively. The source of the driver switch T3 is also coupled to the reset charging circuit 11.

The reset charging circuit 11 includes a multiplexer having a first reset signal input terminal 111, a second reset signal input terminal 112, a reset output terminal 113, and a reset control terminal 114. The first reset signal input terminal 111 receives a fast charging signal Vini_H, the second reset signal input terminal 112 receives a reset initialization signal Vini, and the reset control terminal 114 receives a selection signal SCN3 so as to sequentially select the fast charging signal and the reset initialization signal to output from the reset output terminal 113.

The reset charging circuit 11 is coupled to the reset energy storage element 12. During when the driver switch T3 is reset, the reset charging circuit 11 at least sequentially output the fast charging signal Vini_H and the reset initialization signal Vini to the reset energy storage element 12. The fast charging signal Vini_H is for fast charging the reset energy storage element 12, and the reset initialization signal Vini is for adjusting the voltage output from the reset energy storage element 12's to the driver switch T3's to-be-reset terminal to a preset voltage Vini.

The compensation circuit 10 further includes a reset switch T4 electrically connected between the reset output terminal 113 and the reset energy storage element 12. A control terminal of the reset switch T4 receives a first pulse signal SCN1, which is synchronous with the selection signal SCN3 and has a larger pulse width than that of the selection signal SCN3.

The compensation circuit 10 further includes a first switch T1 and a second switch T2. The first switch T1 has an input terminal receiving a reference signal, and an output terminal electrically connected to the reset energy storage element 12 and the driver switch T3's to-be-reset terminal. The second switch T2 has an input terminal electrically connected to the output terminal of the first switch T1, and an output terminal electrically connected between the reset switch T4 and the reset control terminal 114 of the multiplexer.

A control terminal of the second switch T2 receives the first pulse signal SCN1, and a control terminal of the first switch T1 receives a second pulse signal SCN2, which lags behind the first pulse signal SCN1.

Figure 2:
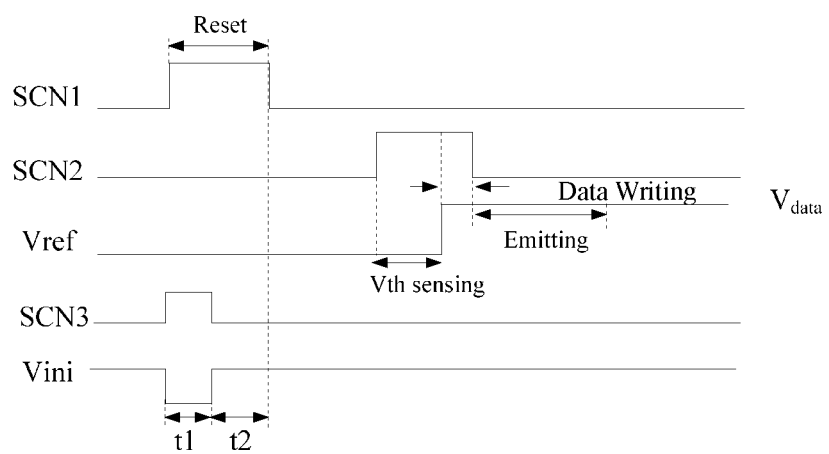
FIG. 2 is a waveform diagram showing the operation of the compensation circuit of FIG. 1.

FIG. 2 is a waveform diagram showing the operation of the compensation circuit described above. In general, the entire compensation process includes four stages: Reset, Vth (threshold voltage) sensing, Data writing, and Emission, which are described in details below.

During the Reset stage, the selection signal SCN3 on the reset control terminal 114 of the reset charging circuit 11 is at a high level. The multiplexer, therefore, selects fast charging signal Vini_H on the first reset signal input terminal 111. The fast charging signal Vini_H has a lower level than that of the reset initialization signal Vini. In the meantime, the first pulse signal SCN1 on the control terminals of the second switch T2 and the reset switch T4 is at a high level, and the second pulse signal SCN2 on the control terminal of the first switch T1 is at a low level. Therefore, the second switch T2 and the reset switch T4 are conducted and the first switch T1 is cut off. The reset energy storage element 12 is as such fast charged. After an interval t1, the selection signal SCN3 on the reset control terminal 114 of the reset charging circuit 11 becomes a low level, the reset initialization signal Vini on the second reset signal input terminal 112 is selected. Then the reset energy storage element 12 is fully charged after an interval of t2, and the voltages at the gate and source of the driver switch T3 is reset to the preset level Vini.

The purpose of selecting the reset initialization signal Vini on the second reset signal input terminal 112 during the interval t2 is to satisfy the driver switch T3's cut off condition VGL−Vini<Vth where Vth is the threshold voltage. In other words, during the Reset stage (t1+t2), the fast charging signal Vini_H cannot always be selected to constantly charge the reset energy storage element 12. Otherwise, when the reset energy storage element 12 has finished charging, the cut-off condition of the driver switch T3 cannot be satisfied and the driver switch T3 cannot be turned off.

As shown in FIG. 2, during the Vth sensing stage, the first pulse signal SCN1 to the control terminals of the second switch T2 and the reset switch T4 is at a low level, and the second pulse signal SCN2 to the control terminals of the first switch T1 is at a high level. Therefore, the second switch T2 and the reset switch T4 are cut off, and the first switch T1 is conducted. The reference signal of a low-level Vref on the input terminal of the first switch T1 is applied to the gate of the driver switch T3. If the driver switch T3 is turned on, the source voltage of the driver switch T3 becomes Vref−Vth, and the voltage between gate and source Vgs or the voltage across the reset energy storage element 12 is equal to Vth. In other words, by turning on the driver switch T3, the reset energy storage element 12 stores a voltage equal to the threshold voltage Vth of the driver switch T3.

To sense the threshold voltage Vth of the driver switch T3 and charge the reset energy storage element 12 to Vth, the condition is Vref−Vini>Vth, meaning that the voltage between the gate and source of the driver switch T3 has to be greater than Vth so as to turn on the driver switch T3 until the reset energy storage element 12 is charged to Vth. In addition, the OLED has to be prevented from being turned on and lit so as not to affect the sensing of the threshold voltage Vth of the driver switch T3, the source voltage of the driver switch T3 has to be less or equal to OLED's threshold voltage.

As shown in FIG. 2, during the Data writing stage, the second switch T2 and the reset switch T4 remain cut off and the first switch T1 remains conducted. In the meantime, the reference signal on the input terminal of the first switch T1 becomes a high-level Vdata and Vdata is applied to the gate of the driver switch T3. The source voltage of the driver switch T3 from the previous stage is Vref−Vth+ΔV(t). Then the voltage between gate and source or across the reset energy storage element 12 is Vgs=Vdata−Vref+Vth−ΔV(t). Due to the capacitance coupling effect of the reset energy storage element 12, ΔV(t)=(Vdata−Vref)*C/(C+COLED) where C and COLED are the capacitances of the reset energy storage element 12 and OLED, respectively.

As shown in FIG. 2, during the Emitting stage, the first pulse signal SCN1 on the control terminals of the second switch T2 and the reset switch T4, and the second pulse signal SCN2 on the control terminal of the first switch T1 are at a low level. The first switch T1, the second switch T2, and the reset switch T4 are all cut off. The current I flowing through the driver switch T3 is I=K(Vgs−Vth)$^2$=K(Vdata−Vref−ΔV(t))$^2$ where K=W/L×C1×u, W is the channel width, C1 is the intrinsic capacitance between the gate and channel, u is the carrier mobility, of the driver switch T3. From the above equation, the current is not related to the threshold voltage Vth of the driver switch T3, thereby eliminating the influence of the threshold voltage Vth of the driver switch T3 on the current I.

In the above embodiment, the reset energy storage element 12's charge time is significantly reduced by employing a multiplexer to select the fast charging signal during the Reset stage to fast charge the reset energy storage element 12. The reset efficiency and compensation effect to the threshold voltage of the driver switch T3 are both enhanced.

Figure 3:
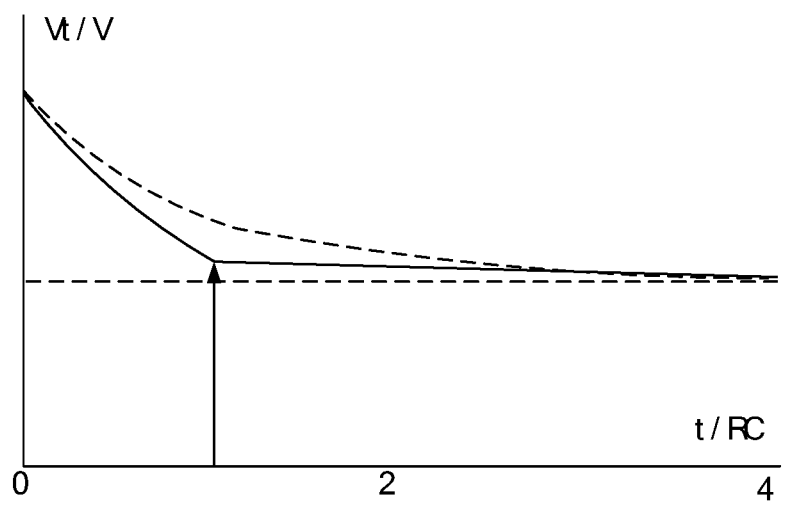
FIG. 3 is a graph showing the voltage variation of a reset energy storage element of the compensation circuit of FIG. 1.

FIG. 3 is a graph showing the voltage variation of the reset energy storage element where the dotted curve shows the scenario that the reset energy storage element is charged by a single voltage (i.e., the prior art) whereas the solid curve shows the scenario that the reset energy storage element is charged by two voltages: the fast charging signal Vini_H from the first reset signal input terminal and the reset initialization signal Vini from the second reset signal input terminal.

According to the charging equation of the reset energy storage element, the voltage $V_t$ of the reset energy storage element charged by a single voltage during the Reset stage is $V_t=V_0+(V_{ini}-V_0)*(1-e^{(-t/RC)})$ The voltages $V_{t1}$ and $V_{t2}$ of the reset energy storage element charged by two voltages during the Reset stage (t1+t2) is $V_{t1}=V_0+(V_{ini\_H}-V_0)*(1-e^{(-t1/RC)})$ and $V_{t2}=V_0+(V_{ini}-V_{t1})*(1-e^{(-t2/RC)})$. $V_0$ is an initial voltage of the reset energy storage element. C is the capacitance of the reset energy storage element, R is the circuit resistance perceived from the reset energy storage element. The present disclosure switches the two voltage at the instance t=RC as indicated by the arrowhead of FIG. 3. It should be obvious that, as illustrated in FIG. 3, the speed of the reset energy storage element being reset to Vini by the present disclosure is superior to that by the prior art. The present disclosure, therefore, has an enhanced reset efficiency.

Figure 4:
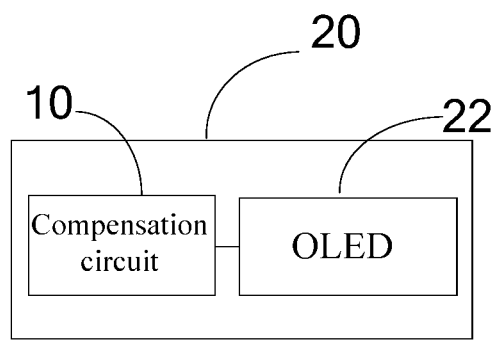
FIG. 4 is a schematic diagram showing an OLED device 20 according to an embodiment of the present disclosure.

FIG. 4 is a schematic diagram showing an OLED device 20 according to an embodiment of the present disclosure. As illustrated, the OLED device 20 includes a compensation circuit 10 and an OLED 22. As shown in FIG. 1, the compensation circuit 10 includes a driver switch T3, a reset energy storage element 12, and a reset charging circuit 11.

The driver switch T3 is for driving a load, whose source is electrically connected to the anode of the OLED 22 and whose drain is electrically connected a positive power voltage OVDD.

The reset energy storage element 12 includes an energy storage capacitor whose two ends are electrically connected to the driver switch T3's gate and source, respectively. The source of the driver switch T3 is also coupled to the reset charging circuit 11.

The reset charging circuit 11 includes a multiplexer having a first reset signal input terminal 111, a second reset signal input terminal 112, a reset output terminal 113, and a reset control terminal 114. The first reset signal input terminal 111 receives a fast charging signal Vini_H, the second reset signal input terminal 112 receives a reset initialization signal Vini, and the reset control terminal 114 receives a selection signal SCN3 so as to sequentially select the fast charging signal and the reset initialization signal to output from the reset output terminal 113.

The reset charging circuit 11 is coupled to the reset energy storage element 12. During when the driver switch T3 is reset, the reset charging circuit 11 at least sequentially output the fast charging signal Vini_H and the reset initialization signal Vini to the reset energy storage element 12. The fast charging signal Vini_H is for fast charging the reset energy storage element 12, and the reset initialization signal Vini is for adjusting the voltage of reset energy storage element 12's output to the driver switch T3's to-be-reset terminal to a preset voltage Vini.

The compensation circuit 10 further includes a reset switch T4 electrically connected between the reset output terminal 113 and the reset energy storage element 12. A control terminal of the reset switch T4 receives a first pulse signal SCN1, which is synchronous with the selection signal SCN3 and has a larger pulse width than that of the selection signal SCN3.

The compensation circuit 10 further includes a first switch T1 and a second switch T2. The first switch T1 has an input terminal receives a reference signal, and an output terminal electrically connected to the reset energy storage element 12 and the driver switch T3's to-be-reset terminal. The second switch T2 has an input terminal electrically connected to the output terminal of the first switch T1, and an output terminal electrically connected between the reset switch T4 and the reset control terminal 114 of the multiplexer.

A control terminal of the second switch T2 receives the first pulse signal SCN1, and a control terminal of the first switch T1 receives a second pulse signal SCN2, which lags behind the first pulse signal SCN1.

FIG. 2 is a waveform diagram showing the operation of a compensation circuit according to an embodiment of the present disclosure. In general, the entire compensation process includes four stages: Reset, Vth (threshold voltage) sensing, Data writing, and Emission, which are described in details below.

The details of the compensation circuit 10 of the OLED device 20 are identical to what has described above and are omitted here.

As described, the present disclosure provides a compensation circuit and an OLED device that, through the employment of a multiplexer to select the fast charging signal to charge the reset energy storage element during the Reset stage where compensation is made to the threshold voltage of the driver switch, the charging time of the reset energy storage element is reduced and the reset efficiency is enhanced.

Embodiments of the present disclosure have been described, but not intending to impose any unduly constraint to the appended claims. Any modification of equivalent structure or equivalent process made according to the disclosure and drawings of the present disclosure, or any application thereof, directly or indirectly, to other related fields of technique, is considered encompassed in the scope of protection defined by the claims of the present disclosure.

What is claimed is:

1. A compensation circuit, comprising:
   a driver switch for driving a load;
   a capacitive element coupled to a to-be-reset terminal of the driver switch;
   a reset charging circuit coupled to the capacitive element comprising a multiplexer having a first reset signal input terminal, a second reset signal input terminal, a reset output terminal, and a reset control terminal where the first reset signal input terminal receives a fast charging signal, the second reset signal input terminal receives a reset initialization signal, and the reset control terminal receives a selection signal; and
   a reset switch electrically connected between the reset output terminal and the capacitive element, where a control terminal of the reset switch receives a first pulse signal;
   wherein, during when the driver switch is reset, the selection signal sequentially selects the fast charging signal and the reset initialization signal to output from the reset output terminal to the capacitive element; the fast charging signal is for fast charging the capacitive element; the reset initialization signal is for adjusting the voltage output from the capacitive element to the driver switch's to-be-reset terminal to a preset voltage; and the first pulse signal is synchronous with the selection signal, and has a larger pulse width than that of the selection signal.

2. The compensation circuit as claimed in claim 1, further comprising a first switch and a second switch, wherein the first switch has an input terminal receiving a reference signal, and an output terminal electrically connected to the capacitive element and the driver switch's to-be-reset terminal; the second switch has an input terminal electrically connected to the output terminal of the first switch, and an output terminal electrically connected between the reset switch and the reset control terminal of the multiplexer; and a control terminal of the second switch receives the first pulse signal, and a control terminal of the first switch receives a second pulse signal, which lags behind the first pulse signal.

3. The compensation circuit as claimed in claim 1, wherein the capacitive element comprises an energy storage capacitor whose two ends are electrically connected to the driver switch's gate and source, respectively; and the source of the driver switch is coupled to the reset charging circuit.

4. The compensation circuit as claimed in claim 3, wherein the fast charging signal has a lower level than that of the reset initialization signal.

5. An Organic Light Emitting Diode (OLED) device, comprising a compensation circuit and an OLED, wherein the compensation circuit comprises a driver switch for driving the OLED, a capacitive element coupled to a to-be-reset terminal of the driver switch, and a reset charging circuit coupled to the capacitive element; during when the driver switch is reset, the reset charging circuit sequentially outputs a fast charging signal and a reset initialization signal to the capacitive element; the fast charging signal is for fast charging the capacitive element; and the reset initialization signal is for adjusting the voltage output from the capacitive element to the driver switch's to-be-reset terminal to a preset voltage;
   wherein the reset charging circuit comprises a multiplexer having a first reset signal input terminal, a second reset signal input terminal, a reset output terminal, and a reset control terminal; the first reset signal input terminal receives the fast charging signal; the second reset signal input terminal receives the reset initialization signal; and the reset control terminal receives a selection signal; and the selection signal sequentially selects the fast charging signal and the reset initialization signal to output from the reset output terminal; and
   wherein the compensation circuit further comprises a reset switch electrically connected between the reset output terminal and the capacitive element, wherein a control terminal of the reset switch receives a first pulse signal; the first pulse signal is synchronous with the selection signal, and has a larger pulse width than that of the selection signal.

6. The OLED device as claimed in claim 5, wherein the compensation circuit further comprises a first switch and a second switch, wherein the first switch has an input terminal receiving a reference signal, and an output terminal electrically connected to the capacitive element and the driver switch's to-be-reset terminal; the second switch has an input terminal receiving the first pulse signal, and an output terminal electrically connected between the reset switch and the reset control terminal of the multiplexer; and a control terminal of the second switch receives the first pulse signal, and a control terminal of the first switch receives a second pulse signal, which lags behind the first pulse signal.

* * * * *